United States Patent
Bark et al.

(10) Patent No.: US 6,734,385 B1
(45) Date of Patent: May 11, 2004

(54) MICROWAVE PLASMA BURNER

(75) Inventors: Yoo Byung Bark, Seoul (KR); Merab I. Taktakkishvili, Kyunggi-do (KR); Sergei I. Gritsinin, Kyunggi-do (KR); Igor Kossyi, Kyunggi-do (KR)

(73) Assignee: Dae Won Paptin Foam Co. Ltd., Yeongi-Gun (KR)

( * ) Notice: Subject to any disclaimer, the term of this patent is extended or adjusted under 35 U.S.C. 154(b) by 0 days.

(21) Appl. No.: 10/009,933
(22) PCT Filed: May 9, 2000
(86) PCT No.: PCT/KR00/00434
§ 371 (c)(1), (2), (4) Date: Nov. 8, 2001
(87) PCT Pub. No.: WO00/69230
PCT Pub. Date: Nov. 16, 2000

(30) Foreign Application Priority Data

May 11, 1999 (KR) .......................... 1999-16733

(51) Int. Cl.[7] ............................................... B23K 10/00
(52) U.S. Cl. .............................. 219/121.48; 219/121.52
(58) Field of Search ....................... 219/121.48, 121.52, 219/121.57, 121.5, 121.36, 121.59, 686, 121.43; 204/298.37, 298.38; 356/316; 315/111.51; 118/723 MP

(56) References Cited

U.S. PATENT DOCUMENTS

| | | | |
|---|---|---|---|
| 4,924,061 A | | 5/1990 | Labat et al. |
| 5,051,557 A | | 9/1991 | Satzger |
| 5,083,004 A | * | 1/1992 | Wells et al. ............. 219/121.5 |
| 5,389,153 A | * | 2/1995 | Paranjpe et al. ...... 118/723 MP |
| 5,479,254 A | * | 12/1995 | Woskov et al. ............. 356/316 |
| 5,565,118 A | * | 10/1996 | Asquith et al. ........ 219/121.57 |
| 5,734,143 A | * | 3/1998 | Kawase et al. ........ 219/121.43 |
| 6,225,745 B1 | * | 5/2001 | Srivastava ............. 315/111.51 |

FOREIGN PATENT DOCUMENTS

| | | |
|---|---|---|
| EP | 0710054 | 5/1996 |
| JP | 03057199 | 3/1991 |
| JP | 06005384 | 1/1994 |
| JP | 06290896 | 10/1994 |
| JP | 09199294 | 7/1997 |

OTHER PUBLICATIONS

Koretzky, E.; Kuo, S.P.; "Interaction of Electromagnetic Waves with Plasma Torches"; Plasma Science, Jun. 3, 1998. 25th Anniversary. IEEE Conference Record Jun. 3, 1998; p. 239.

* cited by examiner

Primary Examiner—Quang T. Van
(74) Attorney, Agent, or Firm—Bazerman & Drangel, PC

(57) ABSTRACT

A microwave plasma burner in which a high temperature plasma is generated. The microwave plasma burner includes a wave inducing tube for receiving and guiding microwaves from an antenna of a magnetron within a wave guide resonator, so as to generate a high temperature plasma by causing vibrations of an injected gas by the help of the microwaves while discharging the injected gas. The microwave plasma burner according to the present invention gives the following effects. A strong high temperature plasma can be generated with a structure not involving vacuum. The flames are generated by the heat which is generated by the vibrations of air, and therefore, a separate igniting device is not required. High temperature flames are generated, and therefore, the burner of the present invention can be used for welding and cutting. A complete combustion occurs due to the heat which is generated by the vibrations, and therefore, any air pollution can be prevented. A desired gas can be selected, and therefore, any oxidation can be prevented during a welding.

1 Claim, 1 Drawing Sheet

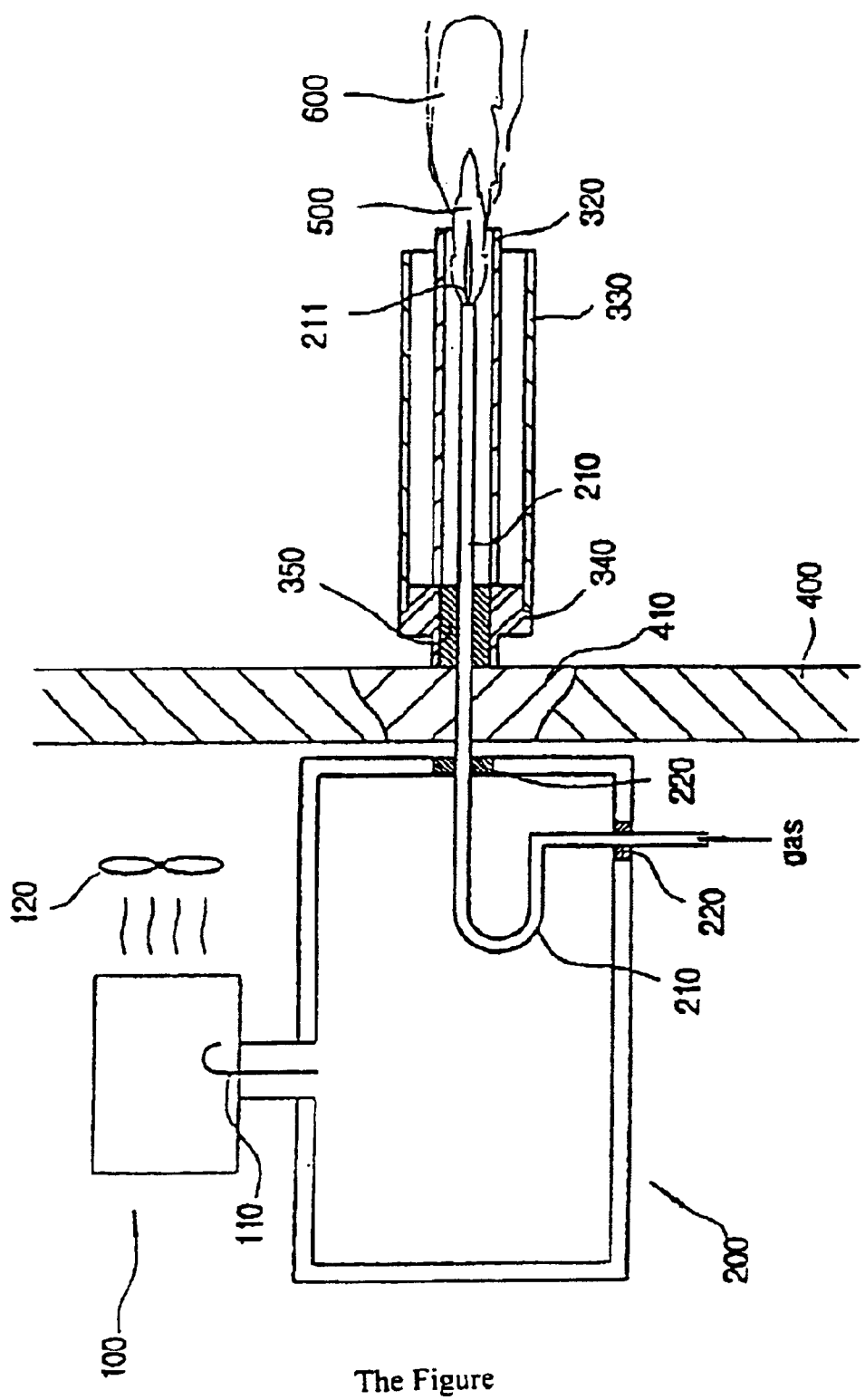
The Figure

MICROWAVE PLASMA BURNER

BACKGROUND OF THE INVENTION

1. Field of the Invention

The present invention relates to a microwave plasma burner in which a high temperature plasma is generated.

2. Description of the Prior Art

Microwaves belong to a frequency region of 30 MHz to 30 GHz, and microwaves are widely applied to various apparatuses such as microwave oven and the like. Particularly, microwaves are utilized in generating a plasma.

In the plasma, the gas is highly ionized, and positive ions and negative ions are present in the same magnitude of density. Thus electrical balance is realized, and a neutralization is attained. The glow discharge tubes and the arcing columns are the typical examples.

Conventionally, in order to generate a plasma by utilizing microwaves, a high vacuum is formed in a chamber, and then, a gas or a gas mixture is injected into the vacuum chamber. The microwaves are irradiated into the chamber.

Then a plasma is generated within the chamber.

However, in this conventional method, a high vacuum is formed within the chamber into which microwaves are irradiated. In order to form the high vacuum, a precise design is required and therefore, the actual manufacture becomes very difficult.

Further, in a welding burner, an igniting device is needed, and therefore, an inconvenience is encountered during the use.

BRIEF SUMMARY OF THE INVENTION

The present invention is intended to overcome the above described disadvantages of the conventional technique.

Therefore it is an object of the present invention to provide a microwave plasma burner in which a high temperature plasma is generated by guiding microwaves without forming a high vacuum.

It is another object of the present invention to provide a microwave plasma burner in which an igniting device is eliminated for ensuring the convenience.

In achieving the above objects, the microwave plasma burner according to the present invention includes: a wave inducing tube for receiving and guiding microwaves from an antenna of a magnetron within wave guide resonator, so as to generate a high temperature plasma by causing vibrations of an injected gas by the help of the microwaves while discharging the injected gas.

Further, the microwave plasma burner according to the present invention includes: a magnetron for outputting microwaves through an antenna; a wave guide resonator for resonating the microwaves from the antenna; and an inducing tube installed within the wave guide resonator, for receiving and guiding the microwaves from the antenna to cause vibrations of an injected gas so as to generate a high temperature heat and a high temperature plasma during a discharge of the injected gas.

BRIEF DESCRIPTION OF THE DRAWING

The above objects and other advantages of the present invention will become more apparent by describing in detail the preferred embodiment of the present invention with reference to the attached drawings in which:

The drawing illustrates the constitution of the microwave plasma burner according the present invention.

DESCRIPTION OF THE PREFERRED EMBODIMENT

The drawing illustrates the constitution of the microwave plasma burner according to the present invention.

As shown in this drawing, the microwave plasma burner according to the present invention includes: a wave inducing tube 210 for receiving and guiding microwaves from an antenna 110 of a magnetron 100 within a wave guide resonator 200, so as to generate a high temperature plasma by causing vibrations of an injected gas by the help of the microwaves while discharging the injected gas.

The inducing tube 210 has a size proportional to that of the antenna 110, and has the same contour as that of the latter. Particularly, the part of the inducing tube 210, which is disposed within the wave guide resonator 200, has the same shape as that of the antenna 110, and has a size twice as large as the antenna 110.

That is, the microwave plasma burner according to the present invention includes: a magnetron 100 for outputting microwaves through an antenna 110; a wave guide resonator 200 for resonating the microwaves from the antenna 110; an inducing tube 210 installed within the wave guide resonator 200, for receiving and guiding the microwaves from the antenna 110 to cause vibrations of an injected gas so as to generate a high temperature heat and a high temperature plasma during a discharge of the injected gas to an end portion 211; a guide tube 320 for surrounding the inducing tube 210 to focus the heat (generated from the end portion 211 of the inducing tube 210); and an outer electrode tube 330 for surrounding the guide tube 320, for preventing the dissipation of the microwaves (released from the end portion 211 of the inducing tube 210).

The inducing tube 210 has a size proportional to that of the antenna 110, and is made of a conductor such as copper or the like.

The guide tube 320 focuses the high temperature flame, and therefore, should be made of a heat resistant insulating material such as quartz or the like. The outer electrode tube 330 is made of a rigid conductive material such as a stainless steel.

A part 220 of the inducing tube 210, which is disposed within the wave guide resonator 200, is made of a non-conductive material such as a ceramic, so that there would be no conduction between the inducing tube 210 and the wave guide resonator 200. A housing 400 which accommodates the magnetron 100 and the wave guide resonator 200 is made of steel, so that the housing 400 can serve as a grounding means, and that the microwaves would not be leaked to the outside. A part 410 which is the contacting portion between the housing 400 and the inducing tube 210 is made of a non-conductive material. A guide 350 which supports the inducing tube 210 to the outside of the housing 400 is made of a non-conductive material, so that any conduction to the inducing tube 210 would not occur. A securing member 340 which is disposed on the outside of the guide 350 so as to secure the guide tube 320 and the electrode tube 330 is made of a conductive material.

The part 410 which is the contacting portion between the housing 400 and the inducing tube 210 is made to be contacted to the securing member 340.

Further, the magnetron 100 generates much heat, and therefore, in order to release the generated heat, there is installed a fan 120 to carry out an air cooling.

The microwave plasma burner of the present invention constituted as above will now be described as to its operation.

If a power is supplied to the magnetron 100, then microwaves are generated. The generated microwaves are supplied through the antenna 110 to the wave guide resonator 200 so as to be resonated.

The microwaves which are resonated within the wave guide resonator 200 are guided by the inducing tube 210 to the end part 211.

If a gas is supplied into the inducing tube 210, then the gas is discharged along the inducing tube 210 to the end part 211.

The gas which is being discharged to the end part 211 of the inducing tube 210 is vibrated by the microwaves which are guided along the surface of the inducing tube 210. During this process, a high temperature heat is generated, and due to the generated heat, flames 500 are produced. Depending on the injected gas, the temperature of the end part 211 becomes different. Particularly, in the case where the atmospheric air is injected, the temperature of the flames of the end part 211 becomes about 3,000 degrees C.

Further, a plasma 600 is formed around the flames 500.

Meanwhile, the guide tube 320 which surrounds the inducing tube 210 focuses the generated flames, while the outer electrode tube 330 prevents the microwaves from being released to the outside.

Thus owing to the high temperature heat, the flames 500 are generated at the end part of the inducing tube 210. Under this condition, depending on the kind of the discharged gas, the temperature of the heat becomes different. Therefore, in accordance with the needs, the kind of the gas can be selected.

For example, during a welding, in accordance with the properties of the welding material, the temperature can be varied. That is, in order to prevent an oxidation and to raise the temperature, one gas can be selected suitably from among nitrogen, carbon, and argon.

Further, in the case where the atmospheric air is injected into the inducing tube 210, a high temperature heat and a plasma are generated due to the vibrations of the microwaves.

Under this condition, the flames are automatically generated at the end part 211 of the inducing tube 210 due to the vibrations of the microwaves, and therefore, a separate igniting device is not required.

According to the present invention as described above, the microwave plasma burner according to the present invention gives the following effects.

First, a strong high temperature plasma can be generated with a structure not involving vacuum.

Second, the flames are generated by the heat which is generated by the vibrations of air, and therefore, a separate igniting device is not required.

Third, high temperature flames are generated, and therefore, the burner of the present invention can be used for welding and cutting.

Fourth, a complete combustion occurs due to the heat which is generated by the vibrations, and therefore, any air pollution can be prevented.

Fifth, a desired gas can be selected, and therefore, any oxidation can be prevented during a welding.

What is claimed is:

1. A microwave plasma burner comprising:

a magnetron for outputting microwaves through an antenna;

a wave guide resonator for resonating the microwaves from said antenna;

an inducing tube installed within said wave guide resonator, for receiving and guiding the microwaves from said antenna to cause vibrations of an injected gas so as to generate a high temperature heat and a high temperature plasma during a discharge of the injected gas;

a guide tube for surrounding said inducing tube to focus the heat generated from the end portion of said inducing tube; and an outer electrode tube for surrounding said guide tube, for preventing a dissipation of the microwaves released from the end portion of said inducing tube.

* * * * *